United States Patent [19]

Hethcoat

[11] Patent Number: 5,048,549

[45] Date of Patent: Sep. 17, 1991

[54] APPARATUS FOR CLEANING AND/OR FLUXING CIRCUIT CARD ASSEMBLIES

[75] Inventor: Gary L. Hethcoat, Ontario, Calif.

[73] Assignee: General Dynamics Corp., Air Defense Systems Div., Pomona, Calif.

[21] Appl. No.: 573,442

[22] Filed: Aug. 27, 1990

Related U.S. Application Data

[62] Division of Ser. No. 164,170, Mar. 2, 1988, Pat. No. 4,986,462.

[51] Int. Cl.⁵ .............................................. B08B 3/02
[52] U.S. Cl. ................................ 134/122 R; 134/172; 134/199; 134/902
[58] Field of Search ............... 134/131, 172, 198, 199, 134/122, 902; 228/33, 37

[56] References Cited

U.S. PATENT DOCUMENTS

| | | | |
|---|---|---|---|
| 721,445 | 2/1903 | Holmstrom | 134/180 |
| 1,561,503 | 11/1925 | Barry et al. | 134/199 |
| 2,322,417 | 6/1943 | Christian | 134/199 |
| 2,347,781 | 5/1944 | Johnston et al. | 134/180 |
| 3,082,774 | 3/1963 | Benton et al. | 134/63 |
| 3,101,730 | 8/1963 | Harris et al. | 134/167 |
| 3,190,793 | 6/1965 | Starke | 162/278 |
| 3,224,914 | 12/1965 | Benton et al. | 134/181 |
| 3,266,502 | 8/1966 | Copeland | 134/181 |
| 3,291,143 | 12/1966 | Huddle | 134/199 |
| 3,298,588 | 1/1967 | Shomphe | 228/20 |
| 3,536,127 | 10/1970 | Tafel | 164/283 |
| 3,603,329 | 9/1971 | White et al. | 134/107 |
| 3,616,807 | 11/1971 | Collins et al. | 134/199 |
| 3,689,333 | 9/1972 | Hillhouse | 156/14 |
| 3,865,298 | 2/1975 | Allen et al. | 228/20 |
| 3,868,272 | 2/1975 | Tardoskegi | 134/131 X |
| 4,589,585 | 5/1986 | Long, Jr. | 228/119 |
| 4,767,344 | 8/1988 | Noschese | 439/83 |
| 4,769,083 | 9/1988 | Tiritilli | 134/6 |

Primary Examiner—Kenneth J. Ramsey
Attorney, Agent, or Firm—Neil Martin; Leo R. Carroll

[57] ABSTRACT

Apparatus and a process are disclosed for cleaning and/or fluxing circuit card assemblies. The assemblies are moved through an enclosure in which they are sprayed with cleaning and/or fluxing liquid from fenestrated cylinders rotating above and below the path of the assemblies and disposed laterally thereacross. The complex spray impact pattern created by the simultaneous movements of the assemblies and the cylinders effects thorough cleaning and/or fluxing of the assemblies. Separate control of liquid pressure from the cylinders prevents unsoldered components from being dislodged from the assemblies during cleaning and or fluxing.

9 Claims, 2 Drawing Sheets

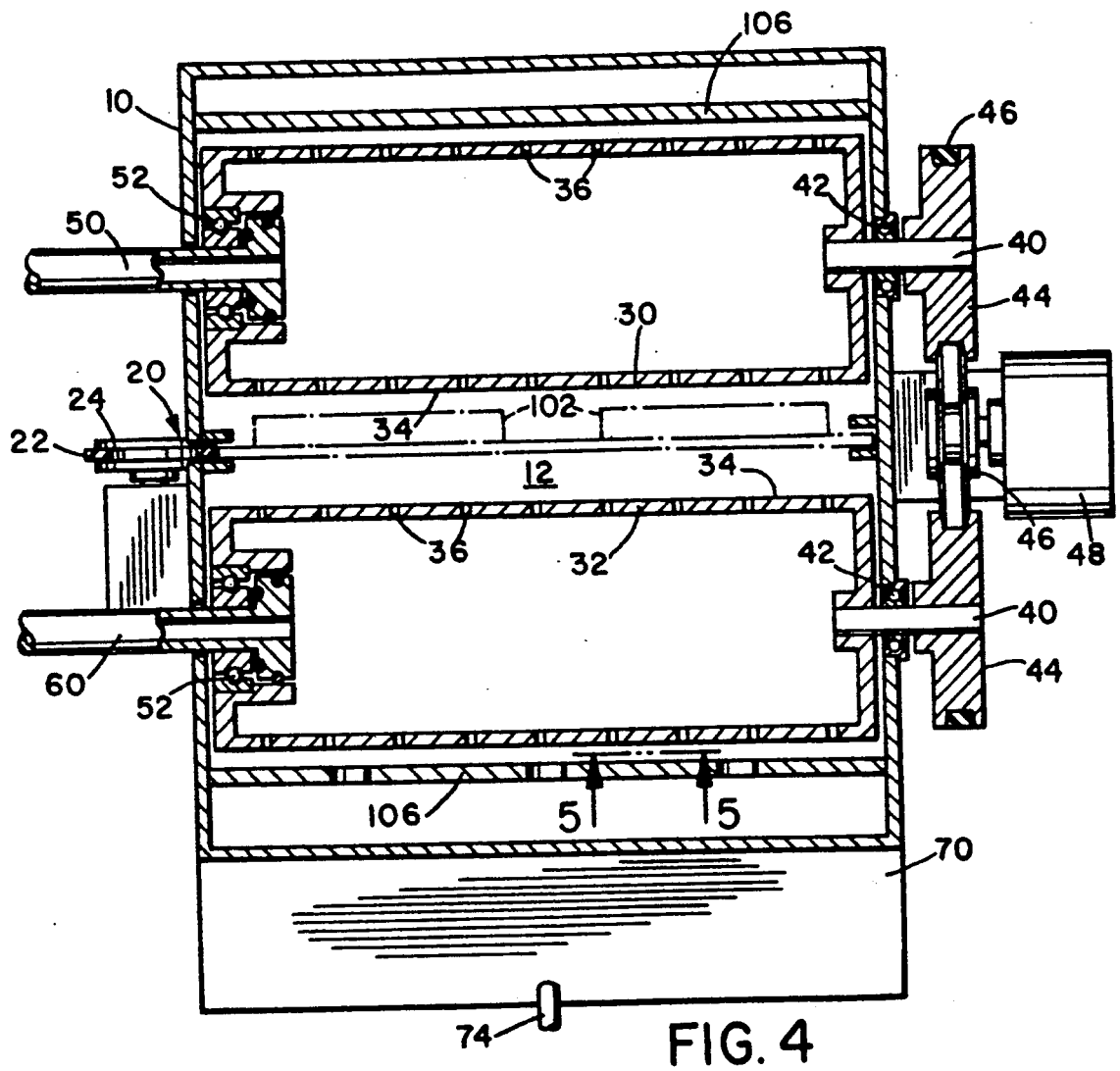
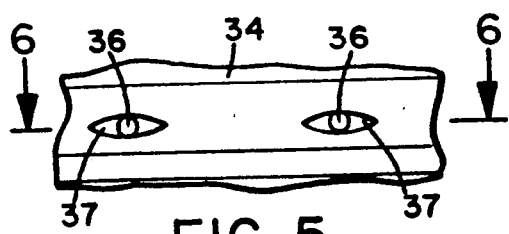
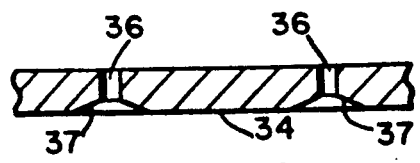

APPARATUS FOR CLEANING AND/OR FLUXING CIRCUIT CARD ASSEMBLIES

RELATED APPLICATION

This is a divisional of U.S. Pat. No. 4,986,462 which issued Jan. 22, 1991, Ser. No. 07/164,170 filed Mar. 2, 1988.

FIELD OF THE INVENTION

The invention herein relates to devices and methods for cleaning and/or fluxing electrical components.

BACKGROUND OF THE INVENTION

The Government has rights in this invention pursuant to Contract No. N00024-85-C-5500, awarded by the U.S. Navy.

In the electronics industry it is common to construct circuit boards by placing the electronic components on the board in the proper position with respect to the printed circuitry and then to form all the soldered connections simultaneously by use of an apparatus such as a wave soldering device. There are however, several problems associated with this procedure.

It is important that all connections to be soldered be properly fluxed before entering the wave soldering device, so that adequate solder connections will be made. Many of the techniques now available do not allow for rapid and complete flux application.

It is also important that the printed circuitry on the board and the contacts on the various components be clean, so that both the flux and the solder can properly adhere. Again, the techniques currently available do not provide for rapid and complete cleaning. In fact, in many cases, the cleaning fluids fail to reach all areas of the board or the components or they fail to adequately remove the contaminants that are trapped in small openings.

In addition, following the soldering step it is often necessary to clean the boards again to remove excess flux or solder and to be sure that through holes in the board which are intended to be left open are cleaned of any solder or flux that may have closed them.

In the past there have been numerous devices to spray fluids on passing articles. Commonly, the articles are transported through a spray chamber on a moving belt or similar device and are sprayed with fluid as they pass spray nozzles. Such devices have been used in the past to wash such diverse things as vegetables and paper making felts, to apply etching solutions to metal plates or to apply solder to electrical conductors on circuit boards. In most cases the impact of the sprays on the articles being washed, etched, soldered, etc., has not had any significant effect on the structure of the article itself or on its travel through the spray chamber. Unwanted movement of light objects such as cans on a conveyer belt under the force of the cleaning spray has been compensated for simply by having a second conveyer belt placed in direct proximity to the cans to limit any such motion.

Circuit card assemblies pose a much more difficult problem, however. The various components are placed on the board but are not secured firmly in their positions until the soldering step has been completed. Consequently, the cleaning and fluxing steps before the soldering must be done with considerable care so that the components are not dislodged from the proper positions. Many of the cleaning devices heretofore known have been unable to properly clean or flux such circuit card assemblies without causing significant amounts of dislodging and dislocation of the components.

It would therefore be of considerable interest to have a device which could readily clean and flux circuit card assemblies without risk of dislocating or dislodging any of the components. It would also be of interest to have such a device which could effectively clean and flux the circuit card assemblies by insuring that the cleaning or fluxing fluids would penetrate into all parts of the assembly, thoroughly remove contaminants a:d apply flux to the appropriate contacts. It would al:o be advantageous for such a device to be capable of being used following the soldering of the circuit card assemblies to remove excess flux and solder and to insure that all through passages were properly opened.

BRIEF SUMMARY OF THE INVENTION

The invention herein comprises apparatus to clean or flux circuit card assemblies with a liquid. In its broadest form the apparatus comprises a substantially liquid-tight enclosure with an entrance opening and an exit opening communicating with the interior of the enclosure; means to move the circuit card assemblies along a substantially horizontal path through the interior of the enclosure with entry to and exit from the interior via the respective openings; rotating liquid dispensing means disposed above and below the horizontal path and extending laterally thereacross, the dispensing means having separate portions above and below the path adapted to dispense the liquid in a plurality of sprays directed toward said path from above and below the path; means to rotate the dispensing means; conduit means to convey the liquid separately to the portions of the dispensing means under sufficient pressure to cause the sprays to be dispensed and a plurality of pressure regulation means disposed in the conduit means to separate control of the pressure of said liquid in each of said portions and adapted to permit the liquid in the sprays above said path to be controlled to a different pressure from the liquid in the sprays below the path.

In preferred embodiments the dispensing means comprises two rotating hollow cylinders with perforated surfaces, one disposed above the path and the other disposed below the path. In other embodiments the apparatus also contains means for collecting the liquid that is dispensed in the sprays, filtering it and recycling it to the dispensing means so that it can be reused for additional washing or fluxing. In still other embodiments the invention comprises means for heating the liquid prior to dispensing it as a spray.

In another aspect, the invention is a process for cleaning or fluxing circuit card assemblies with a liquid; moving the assemblies through a substantially liquid-tight enclosure on a generally horizontal path extending from one end of the enclosure to the other end; spraying the assemblies with the liquid simultaneously from above and below the path while the assemblies move along the path, the sprays being dispensed from rotating dispensing means whose linear surface speed parallel to the path is greater than the speed of travel of the assemblies along the path such that the instantaneous angle at which spray encounters the assemblies varies as a function of both the linear travel of the assemblies along the path and the rotation of the spray dispensing means; and draining a substantial portion of the liquid from the assemblies. The cleaning/fluxing process is preferably followed promptly by a soldering step to solder the electrical contacts on the assemblies. If desired, a cleaning process substantially the same as the cleaning/fluxing process but using only cleaning liquid, may follow the soldering step.

BRIEF DESCRIPTION OF THE DRAWINGS

FIG. 4 is a sectional and elevation view taken on line 4—4 of FIG. 2.

FIG. 5 is a detail view of a portion of the surface of one cylinder taken on line 5—5 of FIG. 4.

FIG. 6 is a sectional view of the surface portion taken on line 6—6, of FIG. 4.

DETAILED DESCRIPTION AND PREFERRED EMBODIMENTS

Figure 1:
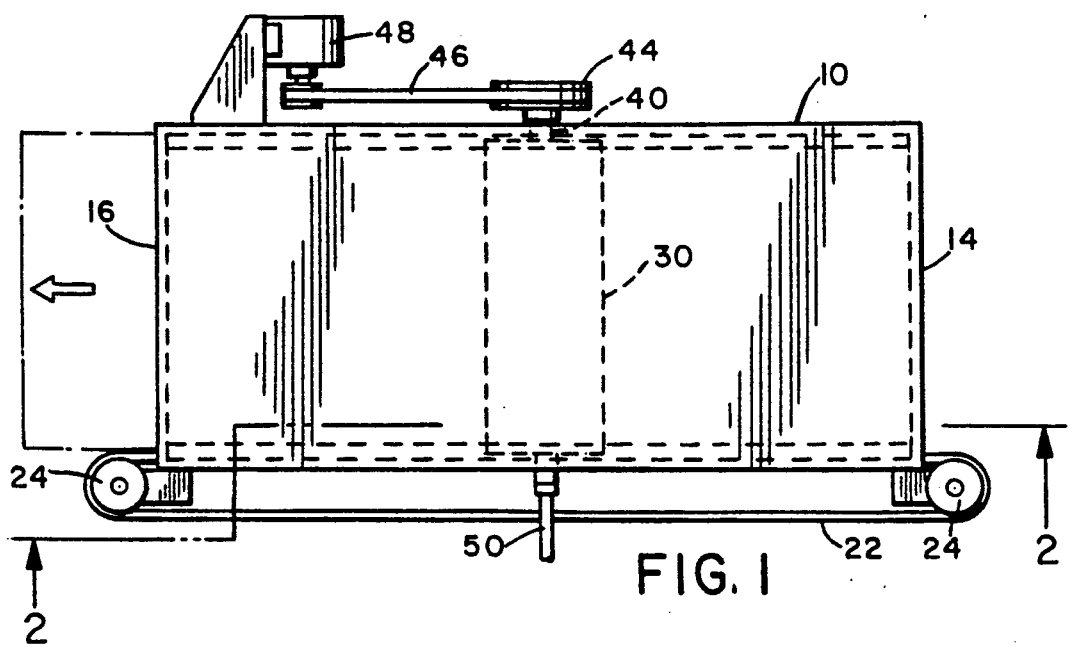
FIG. 1 is a plan view of the device of this invention.
Figure 2:
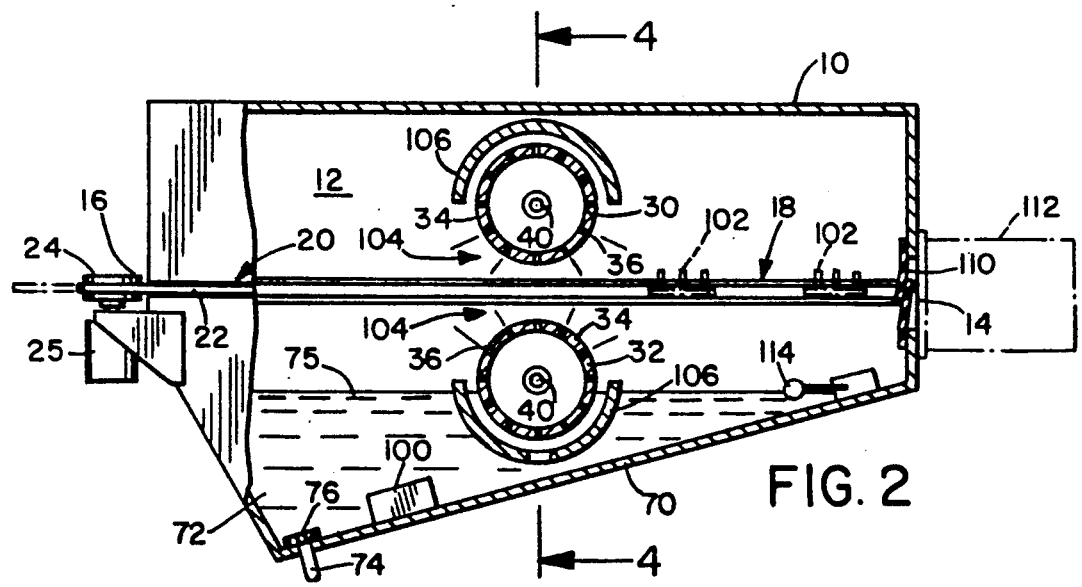
FIG. 2 is a sectional side elevation view taken on line 2—2 of FIG. 1.
Figure 3:
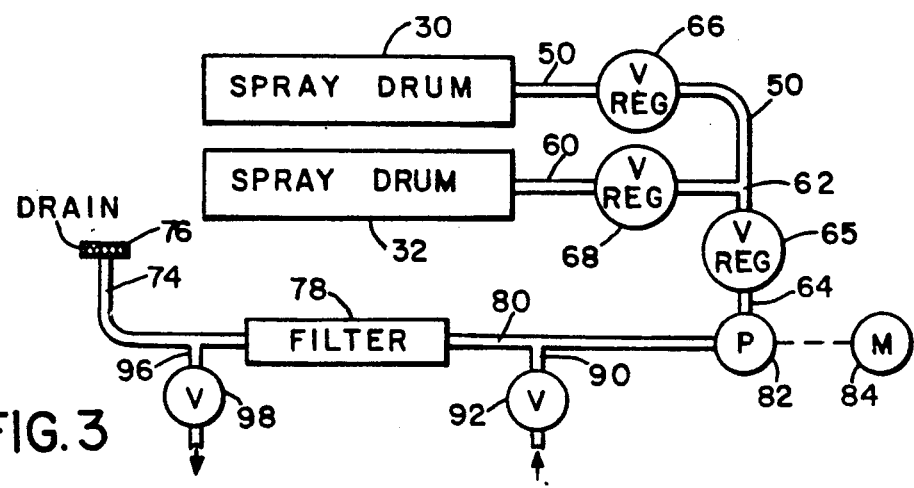
FIG. 3 is a schematic diagram of the recycle and pressure regulation system of this invention.

The nature of the device is best understood by reference to the drawings. The overall configuration is illustrated in FIGS. 1 and 2. A housing 10 forms an interior enclosure 12 in which is defined a substantially horizontal path 18 between them. In preferred practice this device is positioned immediately adjacent to and ahead of a wave soldering system such that cleaned and fluxed circuit card assemblies exiting through exit port 16 pass directly into the wave soldering apparatus, thus minimizing any effect of flux drainage and any opportunity for the circuit card assembly to become re-contaminated.

Passing through the enclosure 12 and entry and exit ports 14 and 16 is conveyer line 20. The particular type of conveyer line 20 which is used will depend on the particular circuit card assemblies to be treated, but in each case the conveyer line 20 will have sufficient openings or perforations such that spray liquids can adequately reach the underside of each of the circuit card assemblies. Normally the conveyer line 20 will have a width just slightly less than the interior width of the enclosure 12, as illustrated in FIG. 1, in order to utilize the apparatus of this invention in an optimum manner.

The conveyer line 20 may be driven by any convenient means, such as the continuous drive chain 22 which is journaled around pulleys 24, at least one of which will be powered by a suitable motor 25. The drive chain 22 or similar driving device will be controlled such that its speed will match the speed of the downstream wave soldering device to insure that the circuit card assemblies are moved smoothly and continuously through both devices.

Mounted in the enclosure 12 are two rotating drums 30 and 32 which extend laterally completely across the enclosure 12 and are disposed on opposite sides of the conveyer line 20. Each of the drums 30 and 32 is a hollow cylinder closed at the ends (except as noted below) and having a fenestrated cylindrical surface 34. The number and size of the openings 36 on surface 34 will be dependent on several factors, including the viscosity of the fluid to be sprayed through the openings, the speed at which the drums 30 and 32 rotate, the pressure under which the fluid is dispensed as spray, and the type of circuit card assemblies which are to be cleaned and/or fluxed. In a typical embodiment the drums 30 and 32 will be approximately 6" in diameter with lengths of approximately 16" yielding drum surfaces of approximately 600 sq. inches. Spray openings 36 will be placed at approximately 1" intervals both longitudinally and radially around the cylindrical surface 34, and will have diameters of approximately ¼". On the outer side of the surface 34 the holes 36 will preferably flare outward in a lens shaped pattern 37 as shown in FIGS. 5 and 6 in order to insure thorough dispersion of the spray and complete coverage of the passing circuit card assemblies. This flared hole shape can be advantageously used to dispose a mixed liquid of fluorinated hydrocarbon cleaner and soldering flux.

Each of the cylinders 30 and 32 has an axle 40 protruding from one end thereof which is Journaled in bearing 42 mounted on the side of housing 10. Also mounted on axle 40 is pulley 44 around which runs drive belt 46 to drive motor 48. At the other end of drum 30 or 32 is hollow cylindrical conduit 50 or 60 respectively which is journaled in bearing 52 mounted on housing 10. The two separate conduits 50 and 60 communicate respectively with the interiors of drums 30 and 32. The purpose of having two separate conduits 50 and 60 is to permit separate control of the sprays in each drum 30 or 32, as will be discussed below. The conduits 50 and 60 meet at tee 62 to which is joined main fluid line 64. Mounted within each of the lines 50 and 60 are pressure controllers 66 and 68 respectively which can be individually adjusted to control separately the fluid sprays being emitted from holes 36.

The bottom 70 of housing 10 is preferably shaped to create a sump 72 at the bottom of the enclosure 12 so that excess spray liquid 75 which is not retained on the circuit card assemblies can be collected and cleaned for recycle and reuse. Mounted at or near the bottom of sump 72 is drain pipe 74 which preferably is capped by a screen 76 to trap large contaminant particles. The removed fluid passes through drain pipe 74 which preferably is a replaceable cartridge filter. The filter medium will be selected to have a porosity adequate to the removed contaminant particles but yet allow proper flow of the cleaning and/or fluxing liquids to the recycle system. The recycle system consists of conduit 80 which passes from the filter to a high pressure fluid pump 82 which is driven by pump motor 84. The pump discharges at high pressure into main fluid feed line 64. Line 64 also contains main pressure regulator 65 which is used to control the overall fluid pressure prior to passing the fluid to conduits 50 and 60. Either or both of the cleaning and/or fluxing liquids can be replenished in the system by feeding in additional fluid through feed line 90 which is controlled by valve 92 and which leads from suitable supply reservoirs (not shown). The enclosure 12 may also be partially or completely drained if desired through drain line 74 and second drain line 96 which is controlled by valve 98 and which leads to collection facilities (not shown).

Also preferably mounted in sump 72 is a heater element 100 which can be used to maintain a desired temperature of the collected liquids so that coagulation or separation of the liquids can be prevented. This is also used to maintain the optimum liquid temperature for cleaning or fluxing the circuit card assemblies.

The operation of the device is highly efficient and reflective of the unique structure of the apparatus. As the circuit card assemblies 102 are moved into the enclosure 12 on conveyer line 20 they immediately begin to be drenched with spray 104 from the rotating drums 30 and 32. As they move closer to the drums 30 and 32 and ultimately pass between them, the amount of spray 104 received increases as does the impact force of the spray 134 against the circuit card assemblies 102. As the assemblies 102 continue to move past the drums 30 and 32 toward exit port 16 the amount and force of the sprays 104 impacting on the circuit card assemblies 102 diminishes. The rotation of the drums 30 and 32 combined with the movement of the assemblies 102 on conveyer line 20 produce the highly sufficient washing and fluxing action of the sprays. It will be evident that as both the cylinders 30 and 32 rotate and the assemblies 102 move horizontally along line 20, the angle at which the sprays 104 hit the assemblies 102 constantly changes in a pattern more complex than a simple pattern obtained by passing an assembly under a stationary spray. This highly complex pattern insures that the spray is not shielded from reaching any part of the assembly by the components on the assembly, since the rotation of the cylinders 30 and 32 serves to follow the assemblies 102 as they pass. Since the cylinders 30 and 32 normally rotate faster than the conveyer line 20 moves, however, the effect is to have the sprays 104 wash over the assemblies 102 in a thorough sweeping motion a number of times as the assemblies 102 move through the enclosure 12. This repeated sweeping motion is not obtained from stationary sprays or from rotating sprays with stationary articles. This system, therefore, by providing the dual motions of the cylinders and the assemblies, produces a unique washing or fluxing system which is significantly more thorough than has been obtainable with prior art devices. In a typical example, using the dimensions exemplified above, the cylinders rotate at approximately 50 RPM giving a linear surface speed relative to the path of the assemblies of approximately 160 feet per minute. The assemblies, on the other hand, move at approximately 4 feet per minute through the chamber, thus giving a relative washing rate of 40 "sweeps of" the wash or flux liquid across the boards as they pass through the enclosure. This is to be contrasted with the single "sweep" which is obtained when a moving assembly passes a stationary spray or a moving spray passes a stationary article.

Not only are the assemblies 102 swept by the wash and/or flux liquids far more times during a single pass through the unit than is possible with the prior art devices, but in addition the multiple sweeps result in much more effective cleaning. This is because each sweep tends to dissolve and dislodge a certain amount of contaminant and leaves that amount of contaminant suspended in the liquid adhering to the assembly. The next sweep tends to wash away that liquid with the contaminant contained therein. It also serves to dissolve and dislodge the next layer of contaminant to be followed by another sweep which washes away the materials dislodged by the second sweep, and so on. A device which provides only a single sweep obviously cannot be as effective in fully removing the contaminants or in dispersing the flux to all surfaces to be soldered. In addition, by combining flux and wash in a single liquid mixture, the early sweeps during passage will serve to be more effective in cleaning while the subsequent sweeps will be more effective in applying flux to the previously cleaned surfaces.

It will be understood that the mention of "sweeps" in this specification are not meant to imply that there must be individual waves of liquid across the assemblies interspersed with periods in which no liquid is being sprayed on the assemblies. That is of course a possible method of operation of the device and could easily be accomplished by having the surfaces of the drums not fully fenestrated so that a longitudinal band of holes is followed by a band in which no holes occur. It is preferred, however, to have the surface uniformly fenestrated so that spray is essentially continuous against the assemblies as they pass through the enclosure. In either context, the term "sweep" as used herein is defined as one full revolution of the drum. Thus one "sweep" will bring all openings on the drum surface into direct proximity to the passing assemblies, regardless of whether the openings are evenly spaced across the surface of the drum or clustered in groups or bands. Thus in the example presented above, the cylinders will make forty complete revolutions ("sweeps") relative to the assemblies each minute.

The second critical aspect of the present invention, in addition to the dual rotation described above, is the variable pressure from the sprays below or above the moving assemblies 102. As noted earlier, the circuit card assemblies 102 reach the enclosure with the various electronic components merely fitted into their mounting holes but not secured therein. While they are sufficiently tightly fitted to maintain their positions during the motion along the conveyer line 20, they are still susceptible to being dislodged from the mounting holes if the force of the sprays is greater than the frictional force holding the components in position. The sprays, on the other hand, must be of sufficient force to wash the liquids into all parts of the assemblies and dislodge any contaminants, as well as spreading flux to all required surfaces. This dilemma is resolved in the present apparatus by the separate pressure controls on the liquids passing respectively to drums 30 and 32. A much stronger force can thus be applied against the upper side of the assemblies 102 by the spray from drum 30. The components can withstand greater impact from this direction since it merely pushes them more firmly into their mounting holes. The spray from the underside, however, will be at a reduced pressure to avoid pushing the components up and out of their mounting holes while still providing adequate washing and fluxing action for the underside of the board.

The particular pressures used will depend on the fluids involved and their viscosity as well as the type of boards being cleaned. Typically the overall system pressure created by the high pressure pump is approximately 400 psi. The main pressure controller 65 maintains the pressure at about 200–400 psi in line 50. The pressure is further reduced to about 50–100 psi in the upper cylinder 30 by pressure controller 66 and about 50–100 psi in the lower cylinder 32 by pressure controller 68. The specific pressures selected will depend on board configuration, conveyer line speed and type and location of components installed on the board. Those skilled in the art will be easily able to select appropriate pressures for specific operations.

It would also be possible if desired to have additional cylinders mounted in the enclosure, either in pairs as 30 and 32 or with more cylinders on one side of the path 18 than on the other. However, in view of the thorough washing and fluxing which can be obtained with a single pair of cylinders, additional cylinders are not usually necessary.

If it is desired to have a series of washings or fluxings so that the fluids do not mix, then it is necessary to have a plurality of the devices of this invention arranged seriatim along the path 18, each with its own conveyer line 20, to allow each separate washing or fluxing to occur and be completed before the next one takes place.

It is also possible to use the device of this invention immediately following the wave solder unit for washing only, since fluxing is no longer needed. In this "downstream" device the cylinders would dispense only washing liquid which would clean away the excess flux and solder as well as insuring that all through holes were satisfactorily opened if they should have inadvertently closed during the soldering procedure.

The device of this invention may be made of any convenient material which will withstand the effects of the spray compositions and the fluid pressures involved. Typically a stainless steel with appropriate rubber or other synthetic gaskets and seals will be quite adequate, although it is possible that some of the more resistant plastics may be used for such things as the housing. Rubber will also be used in the splash curtains 110 which are at each of the exit and entry ports 14 and 16. The combination of the housing and the splash curtains serve to make the entire enclosure substantially liquid-tight to minimize the amount of mist or spray which escapes as the assemblies pass into or out of the enclosure through the ports 14 and 16. The splash curtains 110 need not be located in line with the housing wall as shown in FIG. 2, if there is an extension such as 112 aligned with either the exit port 14 or entry port 16. In fact if such extensions are used it may be possible to dispense with the splash curtains altogether, depending on the volatility of the liquids and the amount of spray which enters the extension.

FIG. 2 also shows optional splash guards 106 surrounding the portions of the drums where the sprays 104 are not directed at the moving assemblies 102. These splash guards 106 tend to deflect spray back in the direction of the assemblies and also to minimize the amount of spray contacting the interior walls of the enclosure. This in turn minimizes the amount of corrosion of the housing wall or the frequency with which the housing wall needs to be cleaned or otherwise maintained.

Also preferably included in the housing is fluid level float sensor 114. This is placed at the point of the desired upper surface of the liquid 75 in the sump 72 and will indicate to the operator when the fluid is above or below that level, thus alerting the operator to the end to drain or replenish the fluid supply. Normally it will be a matter of replenishing the supply since some of the fluid will evaporate, be lost by spray exiting the enclosure or be carried off as flux and wash liquid adhering to the circuit card assemblies. It is desirable that the sensor be one that detects a range of fluid levels so that both the maximum and minimum quantities of liquid desirably in the sump 72 can be controlled.

It will be evident that there are numerous embodiments of this invention which while not expressly illustrated above are clearly within the scope and spirit of the invention. The above disclosure is therefore intended to be exemplary only and the proper scope of the invention is to be defined solely by the appended claims.

I claim:

1. Apparatus to clean or flux circuit card assemblies with a liquid, which comprises:
    a substantially liquid-tight enclosure with an entrance opening and an exit opening communicating with the interior thereof;
    means to move said circuit card assemblies along a substantially horizontal path through said interior with entry to and exit from said interior via said respective openings;
    rotating liquid dispensing means disposed above and below said path and extending laterally thereacross, said dispensing means having separate portions above and below said path adapted to dispense said liquid in a plurality of sprays directed toward said path from above and below said path;
    means to rotate said dispensing means;
    conduit means to convey said liquid separately to said portions of said dispensing means under sufficient pressure to cause said sprays to be dispensed; and
    a plurality of pressure regulation means disposed in said conduit means to separate control of the pressure of said liquid in each of said portions and adapted to permit the liquid in said sprays above said path to be controlled to a different pressure from the liquid in said sprays below said path.

2. Apparatus as in claim 1 wherein said dispensing means comprises two rotating hollow cylinders with perforated surfaces, one disposed above said path and the other disposed below said path.

3. Apparatus as in claim 1 further comprising means to collect said liquid dispensed in said sprays and to filter and recycle it to said dispensing means.

4. Apparatus as in claim 1 further comprising means to heat said liquid.

5. Apparatus as in claim 1 wherein said conduit is adapted to convey a liquid comprising a fluorinated hydrocarbon.

6. Apparatus as in claim 5 wherein said conduit is adapted to convey a liquid comprising a mixture of a fluorinated hydrocarbon and a soldering flux.

7. Apparatus as in claim 1 further comprising a wave soldering device following said apparatus and means to convey said circuit card assemblies to said device immediately after passage through said apparatus.

8. Apparatus as in claim 1 further comprising a wave soldering device preceding said apparatus and means to convey said circuit card assemblies from said device to said apparatus immediately after passage through said device.

9. Apparatus as in claim 1 wherein said means to rotate comprises a motor.

* * * * *